United States Patent [19]
Todd et al.

[11] Patent Number: 6,100,178
[45] Date of Patent: Aug. 8, 2000

[54] THREE-DIMENSIONAL ELECTRONIC CIRCUIT WITH MULTIPLE CONDUCTOR LAYERS AND METHOD FOR MANUFACTURING SAME

[75] Inventors: Michael George Todd, South Lyon; Andrew Zachary Glovatsky, Ypsilanti; Peter Joseph Sinkunas, Canton, all of Mich.

[73] Assignee: Ford Motor Company, Dearborn, Mich.

[21] Appl. No.: 08/808,403

[22] Filed: Feb. 28, 1997

[51] Int. Cl.[7] .......................... H01L 21/4763; H01L 21/00
[52] U.S. Cl. ..................... 438/622; 438/98; 438/674; 216/18; 29/831; 427/98
[58] Field of Search .................... 438/622, 678, 438/98, 674; 216/18; 29/831, 832; 427/98; 156/150

[56] References Cited

U.S. PATENT DOCUMENTS

| | | | |
|---|---|---|---|
| 4,495,232 | 1/1985 | Bauser et al. ................... | 428/41 |
| 4,729,809 | 3/1988 | Dery et al. ...................... | 156/306.6 |
| 4,735,847 | 4/1988 | Fujiwara et al. ................. | 428/209 |
| 4,814,040 | 3/1989 | Ozawa ............................ | 156/634 |
| 4,914,260 | 4/1990 | Suzuki et al. ................... | 174/255 |
| 4,915,983 | 4/1990 | Lake et al. ...................... | 29/831 |
| 4,985,116 | 1/1991 | Mettler et al. .................. | 156/656 |
| 5,004,672 | 4/1991 | D'Ottavio et al. ................ | 430/314 |
| 5,006,182 | 4/1991 | Gantzhorn, Jr. et al. ......... | 156/89 |
| 5,041,183 | 8/1991 | Nakamura et al. ............... | 156/264 |
| 5,090,122 | 2/1992 | Kitagawa ........................ | 29/852 |
| 5,128,831 | 7/1992 | Fox, III et al. ................. | 361/396 |
| 5,225,966 | 7/1993 | Basavanhally et al. .......... | 361/406 |
| 5,264,061 | 11/1993 | Juskey et al. .................. | 156/214 |
| 5,277,734 | 1/1994 | Bayer ............................. | 156/230 |
| 5,290,971 | 3/1994 | Hamaguchi et al. . | |
| 5,428,190 | 6/1995 | Stopperan ...................... | 174/261 |
| 5,837,609 | 11/1998 | Todd et al. ..................... | 438/678 |

FOREIGN PATENT DOCUMENTS 0 614 328 A1  8/1993  European Pat. Off. .

*Primary Examiner*—Charles Bowers
*Assistant Examiner*—Hsien-Ming Lee
*Attorney, Agent, or Firm*—Roger L. May; Leslie C. Hodges

[57] ABSTRACT

A three-dimensional multi-layer electronic device and method for manufacturing same, wherein the device comprises a three-dimensional substrate including a conductive trace on at least one surface of the substrate, a thin layer of dielectric material substantially covering a desired portion of the conductive trace(s) on the substrate, the dielectric layer including vias at selected locations, and applying a coating of conductive material on the dielectric layer and in the vias, and defining a conductive trace in the material to thereby form a multi-layer, interconnected three-dimensional electronic device. Additional layers of dielectric material and conductive traces may be similarly applied to create the desired number of circuit layers. Molded-in structural features, and/or vias may be defined in the appropriate layers to accommodate the attachment and/or interconnection of other electronic devices to the device.

10 Claims, 2 Drawing Sheets

THREE-DIMENSIONAL ELECTRONIC CIRCUIT WITH MULTIPLE CONDUCTOR LAYERS AND METHOD FOR MANUFACTURING SAME

TECHNICAL FIELD

This invention relates to multi-layer electronic circuits which include a three-dimensional substrate and a plurality of layers of conductive traces fabricated on the substrate and/or intervening layers of dielectric material.

BACKGROUND ART

Electronic circuits are commonly manufactured by depositing conductive traces on insulative plastic substrates. Methods of fabricating circuits on three-dimensional (nonplanar) substrates including other molded-in-structural features have also been developed. However, the process for producing the circuitry on three-dimensional surfaces has thus far been limited to one or two layer (i.e., one or both surfaces of the substrate) circuit designs.

DISCLOSURE OF THE INVENTION

One object of the present invention is to provide a multi-layer three-dimensional circuit including a three-dimensional substrate and a plurality of interconnected layers of conductive traces wherein at least one of the conductive traces is substantially electrically isolated from another of the conductive traces by a thin layer of dielectric material.

It is another object of the present invention to provide a method of manufacturing a multi-layer three-dimensional circuit by utilizing a single three-dimensional substrate upon which a plurality of interconnected circuit traces are applied, defined, and interconnected with thin dielectric coatings therebetween.

It is another object of the present invention to provide a method of manufacturing a multi-layer three-dimensional circuit in which minimal material is used to create the multiple dielectric and conductive layers which comprise the circuit.

It is another object of the present invention to provide a method of manufacturing a multi-layer three-dimensional circuit wherein openings (also referred to herein as vias) may be efficiently created during the circuit fabrication process to provide for connections between conductive traces that are not on the top surface of the circuit and additional electronic devices subsequently mounted on the top surface of the circuit.

In carrying out the above and other objects, the method of the present invention includes forming a three-dimensional substrate including an insulative surface, applying an electrical conductor to one or more surfaces of the substrate, defining a circuit trace on the conductive material, then depositing a relatively thin dielectric (non-conductive) layer over the conductive traces. Vias are created in the dielectric layer to create points of interconnect with subsequently deposited conductive layers, or with other electronic components subsequently mounted on or near the circuit. An additional conductive layer is deposited and defined on the dielectric layer, and the conductive material is deposited in the vias, thereby forming an electrical contact between the first conductive layer and a subsequently applied conductive layer. The process of applying dielectric layers, defining vias, applying conductive layers and defining circuit traces thereon is repeated as many times as necessary to produce the required number of conductive layers for the specific electronic circuit application.

In one embodiment of this method, the electrical conductor material is deposited using electroless plating. The circuit trace is defined on the conductive layer by using known circuit masking and chemical etching techniques. The vias are created in the dielectric layer by laser ablation.

The three-dimensional substrate may be created using a number of typical fabrication methods, including injection molding, compression molding, reaction injection molding, thermal forming, or stamping. The material utilized for the substrate may include polymers, metals, or composites. The substrate may itself be composed of a dielectric material. Alternatively, a relatively conductive material may be utilized for the substrate and, after forming, the substrate may be coated with a thin layer of dielectric material to provide the desired insulative surface prior to defining the first conductive trace on the substrate.

The dielectric layer may be composed of polymers, ceramics or other suitable dielectric material that may be quickly and easily applied as a relatively thin layer on the substrate.

It will be appreciated that various other methods may be utilized for depositing the electrically conductive layer on the substrate and/or dielectric layer surfaces, including electrolytic plating, vapor deposition, sputtering, foil lamination, dispensing conductive polymers or inks and thermal spraying. Similarly, other known methods of defining the circuit trace on the conductive layer may be utilized, including laser ablation or machining methods. In addition, the vias may be created in the dielectric layers by other known methods besides laser ablation, such as chemical etching or photo-imaging techniques.

Conductive traces may be defined on one or more of the surfaces of the three dimensional substrate prior to coating one or more portions of the circuit traces on the substrate with the desired additional dielectric layers and additional circuit traces.

The three-dimensional multi-layer circuit of the present invention thus includes a three-dimensional substrate upon which a plurality of layers of interconnected conductive traces, with interleaving layers of dielectric material, have been applied to form a complex, three-dimensional electronic circuit.

The three-dimensional substrate may include integrated structural features, such as connectors, sockets, etc., thereby providing a low-cost, three-dimensional part with state-of-the-art multi-layer electronic circuitry.

The objects, features, and advantages of the present invention are readily apparent from the following detailed description of the best mode for carrying out the invention when taken in connection with the accompanying drawings.

BEST MODE FOR CARRYING OUT THE INVENTION

Figure 1:
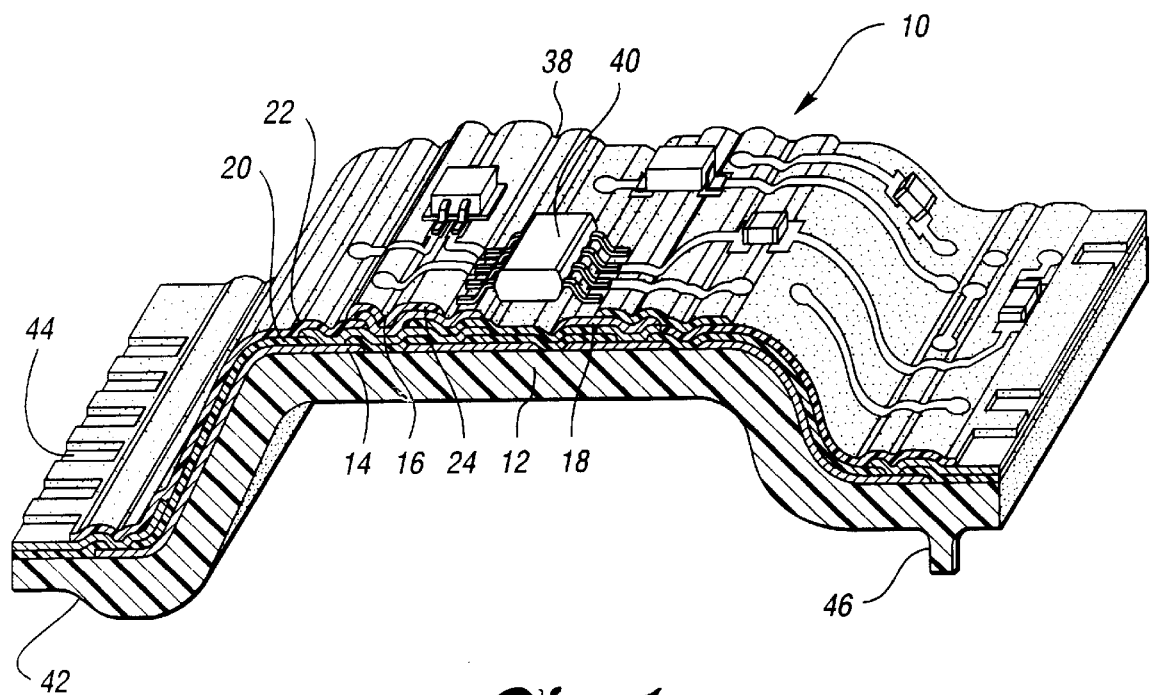
FIG. 1 is a cross-sectional perspective view of one embodiment of the present invention.
Figure 2:
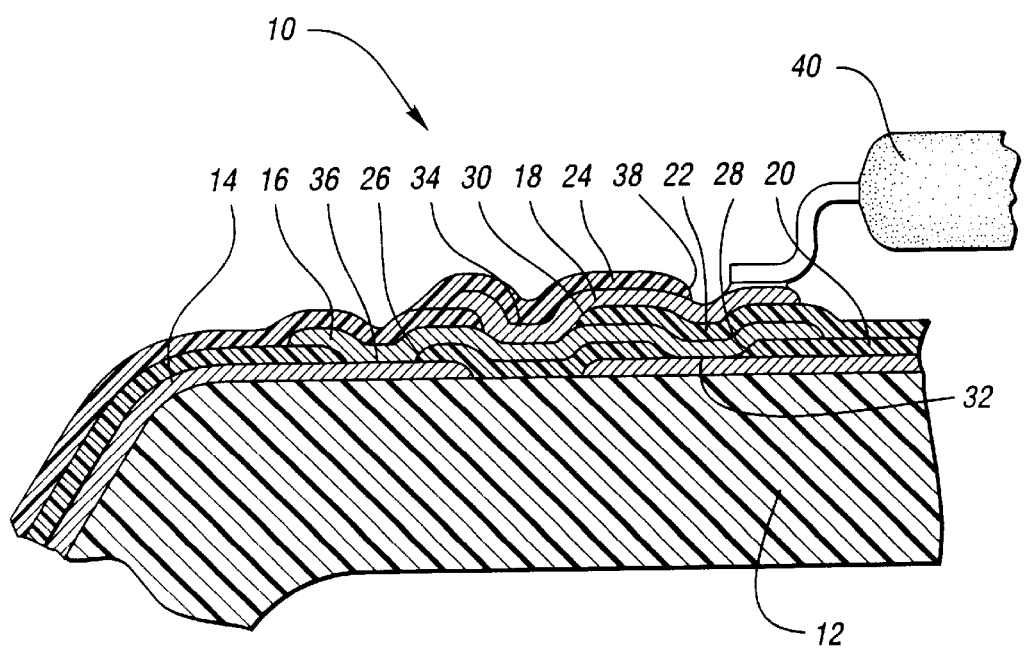
FIG. 2 is an enlarged side view, of a portion of the cross-section of FIG. 1.

Referring now to FIGS. 1 and 2, the circuit of the present invention, generally designated as 10, includes a three-dimensional (i.e., non-planar) substrate 12 upon which multiple conductive layers 14, 16 and 18, each defining a desired circuit trace are applied and, where desired, interconnected. The multiple layers of circuit traces 14, 16 and 18 are separated by insulative layers 20, 22 and 24 of dielectric material. Openings (or vias) 26, 28 and 30 are created in the dielectric layers (such as vias 26 and 28 in layer 20, and via 30 in layer 22) to allow for interconnection of the conductive circuit traces, such as at 32, 34 and 36. Vias 38 may also be defined in an insulative layer 24 to allow for interconnection of a desired electronic component 40 with one or more of the circuit traces.

Figure 3:
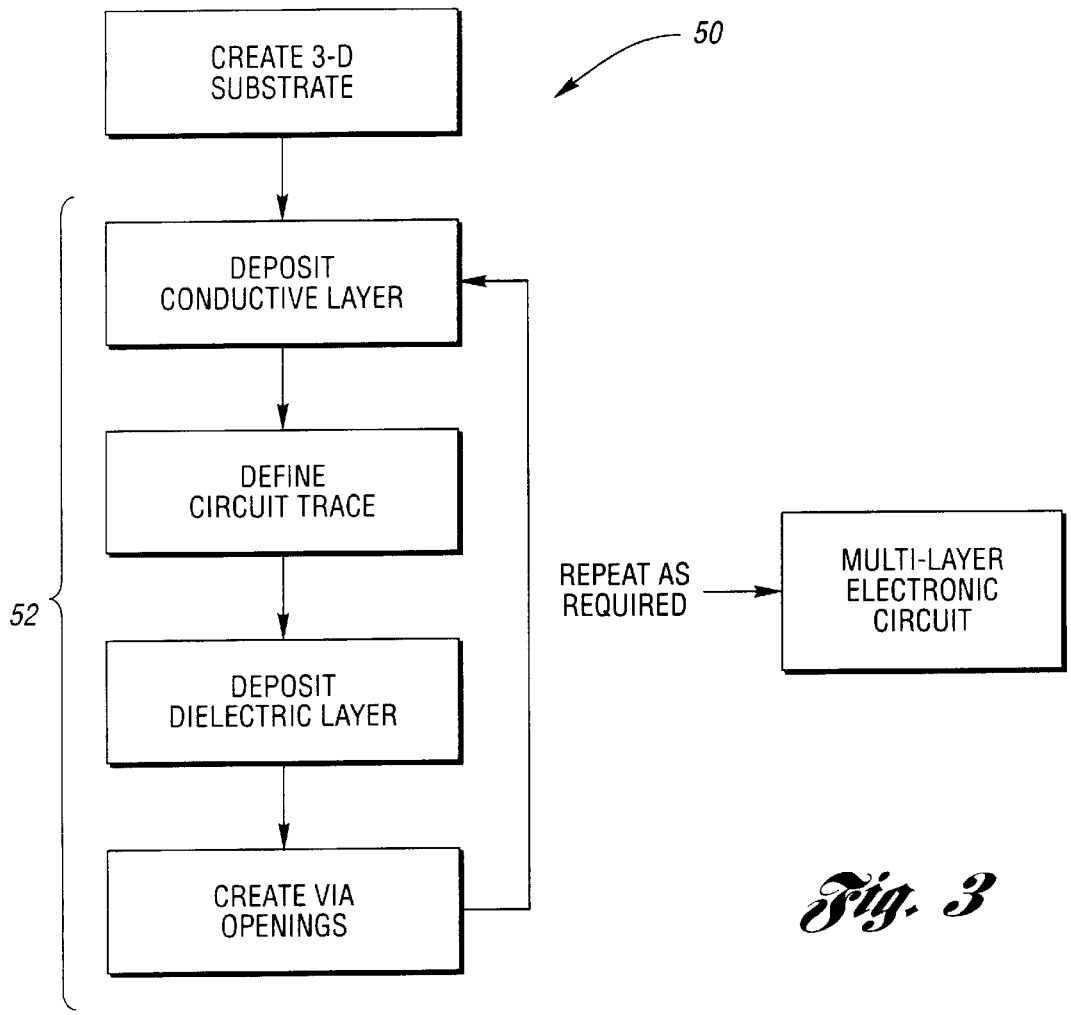
FIG. 3 is a flow diagram of the process of fabricating the three-dimensional circuit according to the present invention.

Referring now to FIG. 3, the method of the present invention includes forming a three-dimensional substrate including an insulative surface, depositing a layer of conductive material on at least one surface of the substrate, defining a circuit trace on the conductive layer, then placing a relatively thin layer of dielectric (non-conductive) material on the conductive trace. Vias are created in the dielectric layer to create sites for interconnection of the circuit trace below the layer with a subsequently applied circuit trace. The operations collectively identified as 52 may be repeated to produce the required number of circuit layers for the specific desired electronic circuit.

The three-dimensional substrate may be created from any material which may be formed to the desired three-dimensional configuration, and which provides the physical characteristics required of the specific part. The dimensions of the substrate will vary with the application and environment in which the finished circuit is to be used. For example, the thickness of the substrate may vary from 0.20 inches to 2.0 inches, with the typical circuit substrates utilized in automotive applications having a thickness of about 0.050 to 0.250 inches. The substrate 12 may be a dielectric material, such as polymers, ceramics, or other conformable composites. Alternatively, the substrate may be created from a conductive material having the desired structural properties. The surface of the conductive substrate is thereafter coated with a dielectric layer, such as substrate 62 of FIG. 4.

The conductive layer may be deposited by any of a variety of known methods, including electroless, electrolytic plating, vapor deposition, sputtering, foil lamination, and thermal spraying. The conductive material is preferably copper, but other materials known to be suitable for printed circuit applications, including nickel, may also be utilized. The conductive trace need only be of sufficient thickness to provide a reliable electrically conductive path for the circuit. The thickness of the trace layer typically ranges from about 0.0005 inches to 0.006 inches.

The circuit trace may be defined on the conductive layer by using any of a number of known methods, including masking and chemical etching, laser ablation, or machining methods.

The dielectric layers may be composed of any of a number of known polymers, ceramics, or other dielectric materials that are suitable to insulate the circuit traces. These layers may be deposited using any of a number of known techniques such as, for example, spray coating, electroplating electrophoritic polymer or dip coating. The dielectric layer is typically substantially thinner, and requires substantially less material, than the substrate. For example, a dielectric layer of from about 0.0005 to 0.003 inches typically provides an adequate insulative layer between two circuit traces.

The substrate may be formed into its three-dimensional configuration by a number of typical fabrication methods which include injection molding, compression molding, reaction injection molding, thermal forming, or stamping.

The vias may be created using known laser ablation, chemical etching, or other material removal techniques.

In one particular embodiment, the three-dimensional substrate is injection molded from 55 percent glass fiber reinforced polyethylene terephthalate (PET). The substrate is then processed through a conventional electroless copper plating line which deposits a flash (i.e., a thin coating, on the order of several micro-inches) of copper over the entire surface of the substrate. The copper coated substrate is then coated with a photosensitive polymer mask, preferably using electrodeposition, then imaged, according to known techniques, to define the circuit patterns. The part is next electrolytically copper-plated to deposit approximately 0.001 inches of copper. The polymer mask is stripped from the part, and the electroless copper flash removed by chemical etching. The three-dimensional substrate of this embodiment now has a single copper conductive circuit trace on each surface. This part is then dip-coated with an epoxyacrylate copolymer to form about a 0.001 inch thick dielectric coating. The polymer coating is then cured using known techniques. Laser ablation is then utilized to create a multitude of approximately 0.005 inch diameter holes in the dielectric coating at points of desired interlayer interconnect. The electroless/electrolytic plating process is repeated on the polymer layer, as well as on subsequently applied polymer layers to create the final multi-layer three-dimensional circuit.

As previously described, conductive traces may be defined on one or more of the surfaces of the substrate prior to coating the circuit traces on the substrate, as required, with the desired additional dielectric layers for application of additional circuit traces. The substrate may also include integral structural features, such as connectors, sockets, etc., which features may provide installation sites for electronic components to be mounted on the circuit, or for accommodating installation or interconnection of the completed circuit at its intended site. For example, a recess 42 may be defined in one edge of the substrate so that the finished circuit 10 may be plugged into another board slot or connector for physical installation of the circuit, as well as to interconnect selected layers of the circuit (through vias 44 which provide such interconnection sites) to another board or electrical component. Another example of the molded-in feature is the locating pin 46, shown in FIG. 1. Other examples of three-dimensional structural features and their potential applications are illustrated in Applicant's co-pending U.S. application Ser. No. 08/642,722, which is hereby incorporated by reference herein to the extent of that disclosure.

Application Ser. No. 08/642,722 is similarly incorporated by reference herein to the extent that it illustrates a method and apparatus for interconnecting circuit traces on opposite surfaces of the three-dimensional substrate, such as might be included in the circuit of the present invention.

It will be appreciated that multiple multi-layer electronic circuits of the present invention might also be physically and/or electronically interconnected as might be suitable for a particular application. Again, application Ser. No. 08/642,722 is incorporated by reference herein to the extent that it discloses a method and apparatus for physically interconnecting multiple three-dimensional substrates. Thus, such substrates might each be fabricated to create multi-layer circuits according to the present invention and then physically and/or electrically interconnected as desired.

Figure 4:
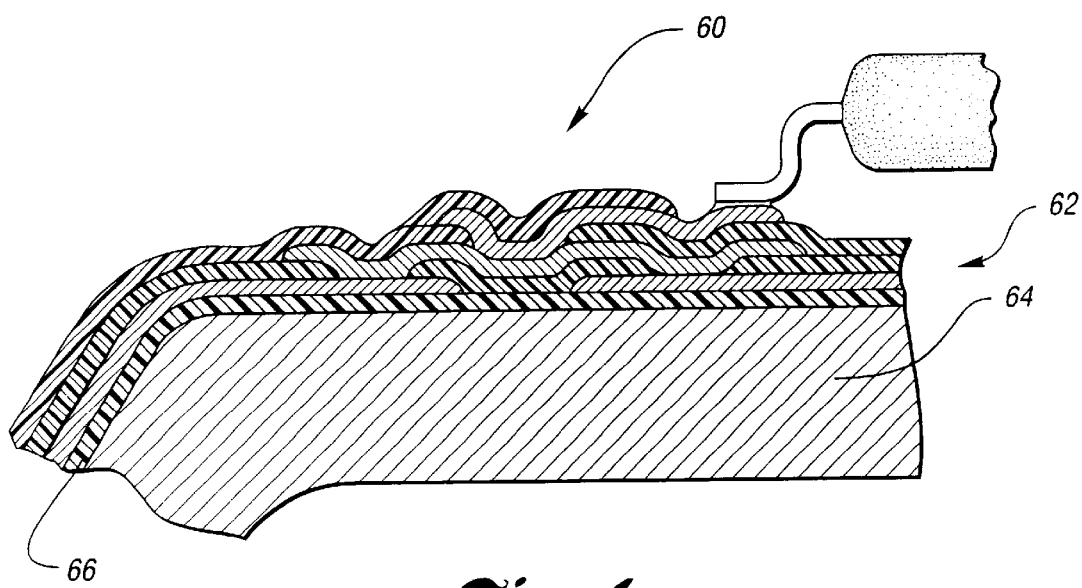
FIG. 4 is an enlarged side view in cross-section of a portion of an alternative embodiment of the present invention.

Referring now to FIG. 4, in alternative embodiment 60 of the multi-layer circuit of the present invention is illustrated as including a substrate 62 which comprises a formable conductive material 64 (such as a conductive epoxy or ink) which is formed into its desired three-dimensional configuration, and upon which is then deposited a thin (approximately 0.001 inches) layer of dielectric material 66 to form the substrate. The subsequent layers of conductive traces and dielectric layers may then be applied as described (and as shown at 52 in FIG. 3) to achieve a multi-layer three-dimensional electronic circuit.

While the best mode for carrying out the invention has been described in detail, those familiar with the art to which this invention relates will recognize various alternative designs and embodiments for practicing the invention as disclosed by the following claims.

What is claimed is:

1. A method of making a multi-layer non-planar circuit comprising:

providing a non-planar substrate;

applying a layer of first conductive material to form a conductive trace on at least one surface of the substrate; and, fabricating at least one additional circuit layer by,
   applying a layer of dielectric material over the conductive trace on the substrate,
   defining vias at selected locations of the dielectric layer for interconnection of the conductive trace on the substrate to other conductive traces; and
   applying a layer of second conductive material in a selected pattern to form another conductive trace on the dielectric layer including applying said second conductive material in the vias to interconnect the conductive trace below the dielectric layer with the conductive trace being applied on the dielectric layer.

2. The method of claim 1 wherein a dielectric material is provided as the non-planar substrate.

3. The method of claim 1 wherein a layer of dielectric material is applied on the surface of the non-planar substrate prior to applying the first layer of conductive material.

4. The method of claim 1 wherein providing a non-planar substrate includes defining integral structural features in the substrate.

5. The method of claim 4 wherein integral structural features are provided in the substrate for accommodating installation of the completed circuit at its intended site.

6. The method of claim 4 wherein the substrate is provided with an integral structural feature which establishes an installation site for an electronic component to be mounted on the circuit.

7. The method of claim 1 wherein the non-planar substrate is fabricated by injection molding.

8. The method of claim 1 wherein the layer of conductive material is applied to the substrate by applying a flash of copper over the entire surface of the part through electroless plating, coating the part with a photosensitive polymer mask, defining an image on the photosensitive polymer mask, electrolytically plating additional copper over the polymer mask, stripping the polymer mask from the part, and removing the electroless copper flash by chemical etching.

9. The method of claim 1 wherein the layer of conductive material is about 0.001 inches thick.

10. The method of claim 1 wherein the layer of dielectric material on the at least one additional circuit is about 0.002 inches thick.

* * * * *